United States Patent
Naem et al.

(10) Patent No.: US 7,098,095 B1
(45) Date of Patent: Aug. 29, 2006

(54) METHOD OF FORMING A MOS TRANSISTOR WITH A LAYER OF SILICON GERMANIUM CARBON

(75) Inventors: Abdalla Aly Naem, Overijse (BE); Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 141 days.

(21) Appl. No.: 10/772,863

(22) Filed: Feb. 4, 2004

Related U.S. Application Data

(62) Division of application No. 10/315,394, filed on Dec. 10, 2002, now abandoned.

(51) Int. Cl.
*H01L 21/8238* (2006.01)
*H01L 21/76* (2006.01)

(52) U.S. Cl. ............... 438/199; 438/207; 438/222; 438/483

(58) Field of Classification Search ............ 438/199, 438/207, 222, 483
See application file for complete search history.

(56) References Cited

U.S. PATENT DOCUMENTS

| | | | |
|---|---|---|---|
| 6,103,603 A | 8/2000 | Han | 438/532 |
| 6,190,975 B1 | 2/2001 | Kubo et al. | 438/285 |
| 6,399,970 B1* | 6/2002 | Kubo et al. | 257/194 |
| 6,472,685 B1 | 10/2002 | Takagi | 257/77 |
| 6,492,216 B1 | 12/2002 | Yeo et al. | 438/197 |
| 6,512,252 B1 | 1/2003 | Takagi et al. | 257/192 |
| 6,597,016 B1 | 7/2003 | Yuki et al. | 257/77 |
| 6,707,132 B1* | 3/2004 | Banerjee et al. | 257/616 |
| 2002/0163027 A1* | 11/2002 | Skotnicki et al. | 257/302 |
| 2002/0179946 A1 | 12/2002 | Hara, et al. | 257/288 |
| 2002/0182423 A1* | 12/2002 | Chu et al. | 428/446 |

OTHER PUBLICATIONS

Stanley Wolf, et al., "Silicon Processing For The VLSI Era", vol. 1, Processing Technology, Lattice Press, 1986, pp. 155.

* cited by examiner

*Primary Examiner*—William M. Brewster
(74) *Attorney, Agent, or Firm*—Mark C. Pickering

(57) ABSTRACT

The vertical diffusion of dopants from the gate into the channel region, and the lateral diffusion of dopants from the source and drain regions into the channel region resulting from thermal cycling during the fabrication of a MOS transistor is minimized by forming the source and drain regions in a layer of silicon germanium carbon.

13 Claims, 5 Drawing Sheets

METHOD OF FORMING A MOS TRANSISTOR WITH A LAYER OF SILICON GERMANIUM CARBON

RELATED APPLICATION

This is a divisional application of application Ser. No. 10/315,394 filed on Dec. 10, 2002, now abandoned.

The present application is related to application Ser. No. 10/315,300 filed on Dec. 10, 2002, now U.S. Pat. No. 6,818,938, and application Ser. No. 10/869,158 filed on Jun. 16, 2004.

DETAILED DESCRIPTION OF THE INVENTION

Figure 1:
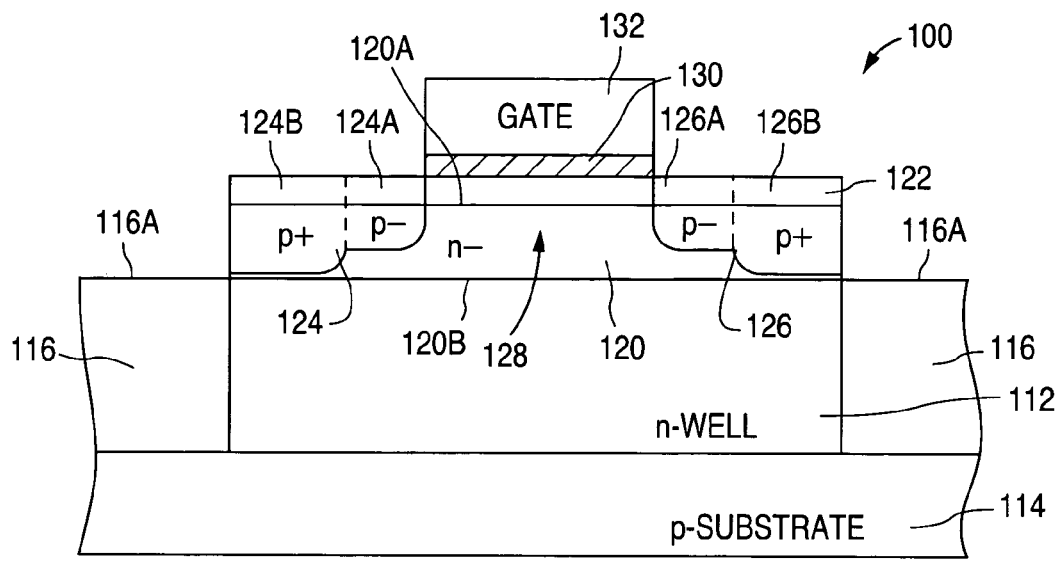
FIG. 1 is a cross-sectional view illustrating an example of a PMOS transistor 100 in accordance with the present invention.

FIG. 1 shows a cross-sectional view that illustrates an example of a PMOS transistor 100 in accordance with the present invention. As described in greater detail below, PMOS transistor 100 utilizes a silicon germanium carbon layer to limit the diffusion of boron atoms into the channel region, thereby minimizing undesired changes in the threshold voltage and channel length of the transistor.

As shown in FIG. 1, PMOS transistor 100 is formed in an n-type semiconductor material 112, such as a substrate or well. In the FIG. 1 example, material 112 is formed as an n-type well in a p-type substrate 114. In addition, material 112 is surrounded by a trench isolation region 116 that has a substantially planar upper surface 116A. (An isolation region with a non-planar upper surface can alternately be used.)

As further shown in FIG. 1, transistor 100 has a layer 120 that includes an n-type dopant, silicon, germanium, and carbon. Layer 120, which is formed on semiconductor material 112, has an upper surface 120A and a lower surface 120B that is substantially coplanar with the upper surface 116A of trench isolation region 116.

In addition, layer 120 can have a uniform or non-uniform distribution of carbon. For example, with a non-uniform distribution of carbon, a heavier concentration of carbon can formed at the upper surface 120A of layer 120. Further, layer 120 can also include regions which are substantially free of carbon. For example, layer 120 can include a layer of silicon that is free of germanium and carbon, and an overlying layer of n-type silicon germanium carbon.

Transistor 100 can also include a cap silicon layer 122 that is formed on layer 120, and spaced-apart p-type source and drain regions 124 and 126 that are formed in layers 120 and 122. (Cap silicon layer 122 is not required, but allows a higher quality gate oxide to be formed during manufacturing.) In addition, transistor 100 includes a channel region 128 that is located between source and drain regions 124 and 126. Source and drain regions 124 and 126 can be formed entirely within layers 120 and 122, or can alternately extend into material 112.

Further, as shown in the FIG. 1 example, source region 124 includes a lightly-doped p-type region 124A and heavily-doped p-type region 124B, while drain region 126 includes a lightly-doped p-type region 126A and a heavily-doped p-type region 126B. Alternately, source and drain regions 124 and 126 can have a uniform p+dopant concentration.

Transistor 100 additionally includes a thin layer of insulation material 130, such as a layer of silicon dioxide, that is formed on cap silicon layer 122 over channel region 128. Further, transistor 100 includes a p-type polysilicon gate 132 that is formed on insulation layer 130 over channel region 128.

Figure 2:
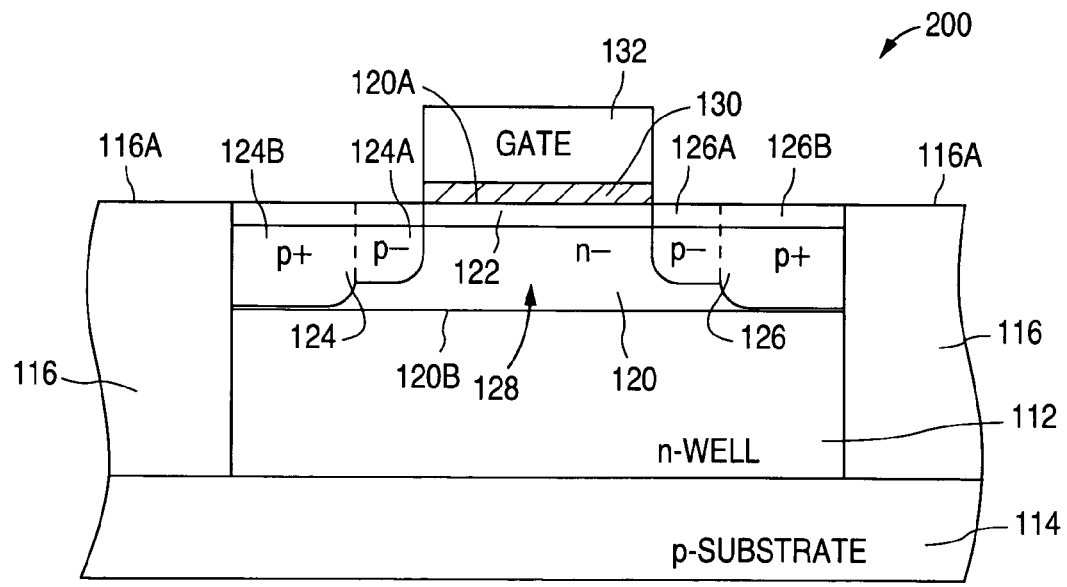
FIG. 2 is a cross-sectional view illustrating an example of a PMOS transistor 200 in accordance with an alternate embodiment of the present invention.

FIG. 2 shows a cross-sectional view that illustrates an example of a PMOS transistor 200 in accordance with an alternate embodiment of the present invention. PMOS transistor 200 is similar to PMOS transistor 100 and, as a result, utilizes the same reference numerals to designate structures that are common to both transistors.

As shown in FIG. 2, transistor 200 differs from transistor 100 with respect to the location of layers 120 and 122. In transistor 200, the bottom surface 120B of layer 120 lies below the top surface 116A of trench isolation region 116, while the top surface of layer 122 is substantially coplanar with the top surface 116A of trench isolation region 116. Transistors 100 and 200 are operated in the same way as a conventional MOS transistor such as transistor 100.

One advantage of the present invention is that the carbon in layer 120 limits the vertical and lateral diffusion of boron atoms into channel region 128 during thermal cycling, such as annealing. As a result, the present invention limits undesirable shifts in the threshold voltage and shortening of the channel length that can lead to punch-through.

Another advantage of the present invention is that by locating the channel region in a silicon germanium carbon layer, as described in the present invention, the mobility of the charge carriers (holes in a p-channel) is substantially increased as compared to a channel region located in a region of silicon.

Figure 3A:
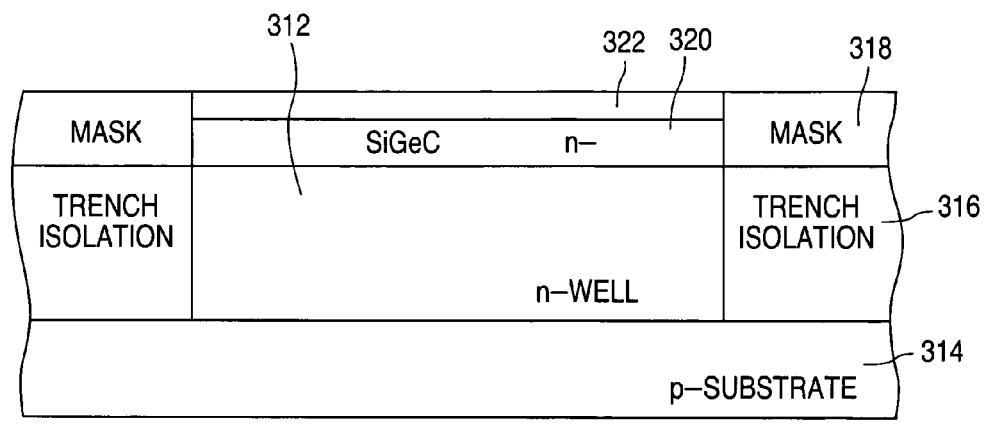
FIGS. 3A–3E are a series of cross-sectional views illustrating an example of a method of forming a PMOS transistor in accordance with a preferred embodiment of the present invention.

FIGS. 3A–3E show a series of cross-sectional views that illustrate an example of a method of forming a PMOS transistor in accordance with the present invention. As shown in FIG. 3A, the method utilizes a conventionally formed wafer that has an n-well 312 that is formed in a p-substrate 314. In addition, the wafer has a trench isolation region 316 that isolates n-well 312 from laterally adjacent regions. Further, n-well 312 and trench isolation region 316 have upper surfaces that are substantially coplanar.

As shown in FIG. 3A, the method begins by forming and patterning a mask 318, such as a hard mask, to expose n-well 312. Next, a layer 320 is selectively epitaxially grown on the exposed surface of n-well 312. With selective epitaxial growth, layer 320 is only grown on the silicon surface of n-well 312. Layer 320 includes an n-type dopant, silicon, germanium, and carbon.

The distribution and concentration of germanium and carbon present in layer 320 depend on when the germanium and carbon are introduced, and the amount of germanium and carbon that are introduced, during the selective epitaxial growth process. For example, silicon that is substantially free of germanium and carbon can be grown, followed by the growth of a layer of n-type silicon germanium carbon where the carbon has either a uniform or non-uniform distribution. Alternately, a layer of n-type silicon germanium carbon can be grown on well 312 with either a uniform or non-uniform distribution of carbon.

Following the formation of layer 320, a layer of cap silicon 322 is optionally formed on layer 320. After this, the upper surface of layer 322 can optionally be planarized to create a substantially flat upper surface. The upper surface of layer 322 can be planarized using, for example, chemical mechanical polishing. Mask 318 is then removed.

(Alternately, the same structure can be realized by growing a layer of silicon that is substantially free of germanium and carbon, followed by the blanket deposition of a layer of silicon germanium carbon. A cap silicon layer is formed, and the structure is masked and etched. The layer of silicon germanium carbon can also be blanket deposited without first forming the layer of silicon that is substantially free of germanium and carbon.)

Figure 3B:
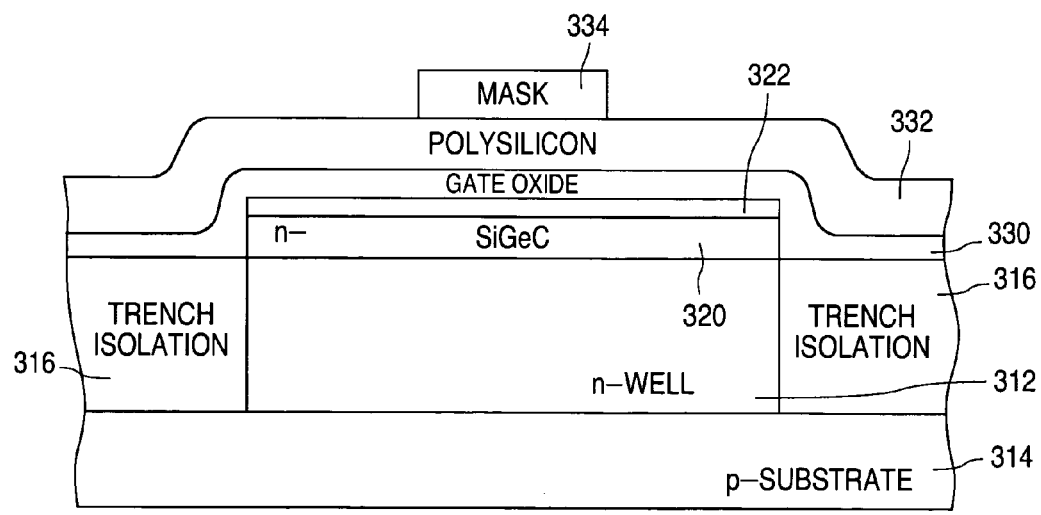

As shown in FIG. 3B, once mask 318 has been removed, a layer of insulation material 330, such as a layer of silicon dioxide, is formed over the exposed surfaces of layers 320 and 322. Following this, a layer of polysilicon 332 is formed on layer 330. After polysilicon layer 332 has been formed, a mask 334 is formed and patterned on polysilicon layer 332. Next, polysilicon layer 332 is anisotropically etched to remove the exposed regions of layer 332 that are not protected by mask 334. Mask 334 is then removed.

Figure 3C:
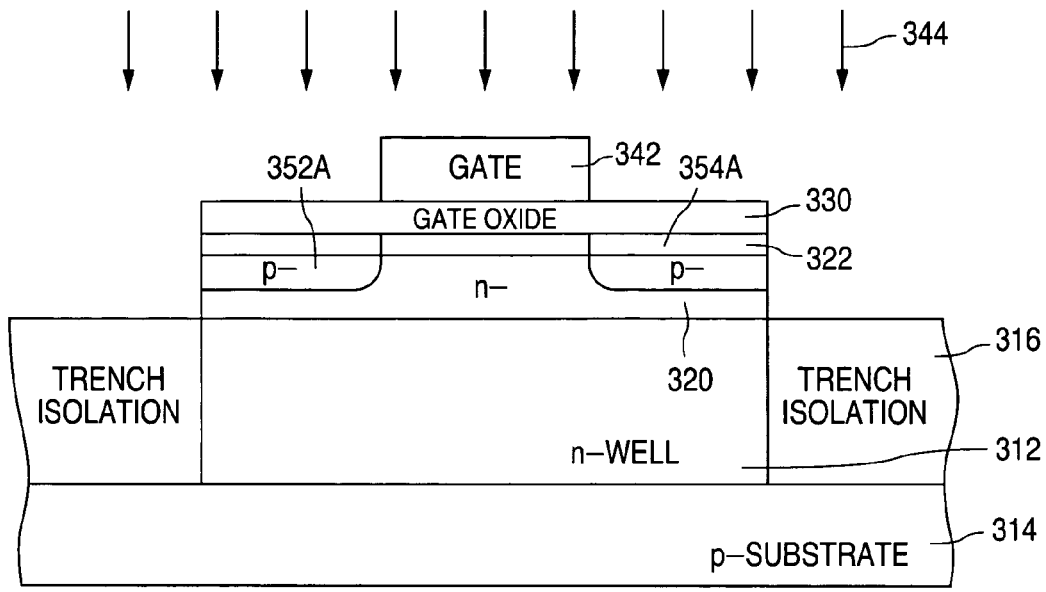
Figure 3D:
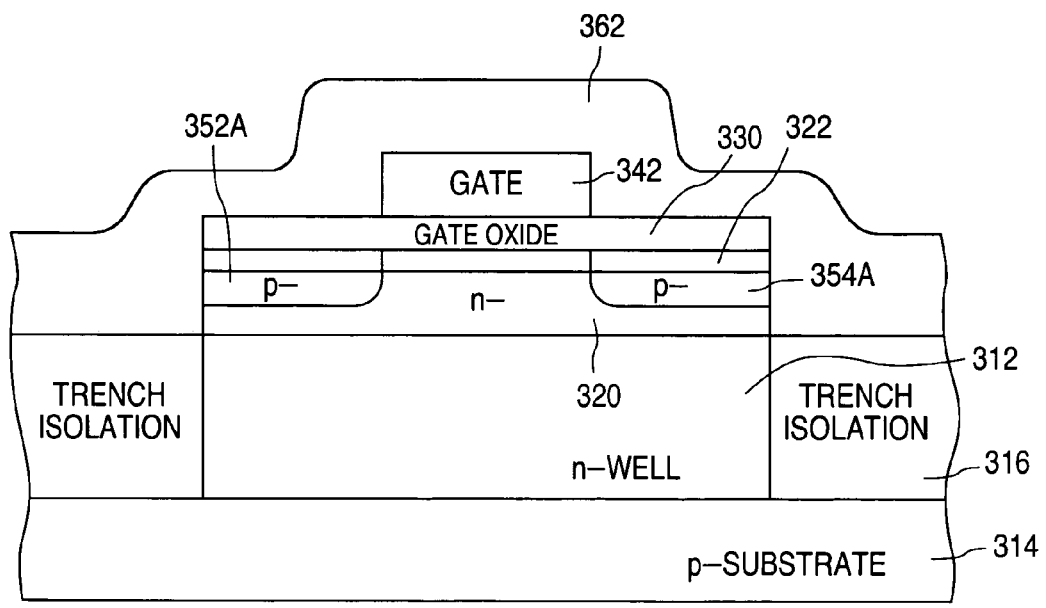

As shown in FIG. 3C, the etch forms a gate 342 from polysilicon layer 332. The method continues by implanting layers 320 and 322, and gate 342 with a p-type dopant 344. The implant dopes gate 342, and forms lightly-doped p-type regions 352A and 354A in layers 320 and 322. Turning to FIG. 3D, a layer of insulation material 362, such as an oxide, is next formed over trench isolation region 316, layer 330, and gate 342.

Figure 3E:
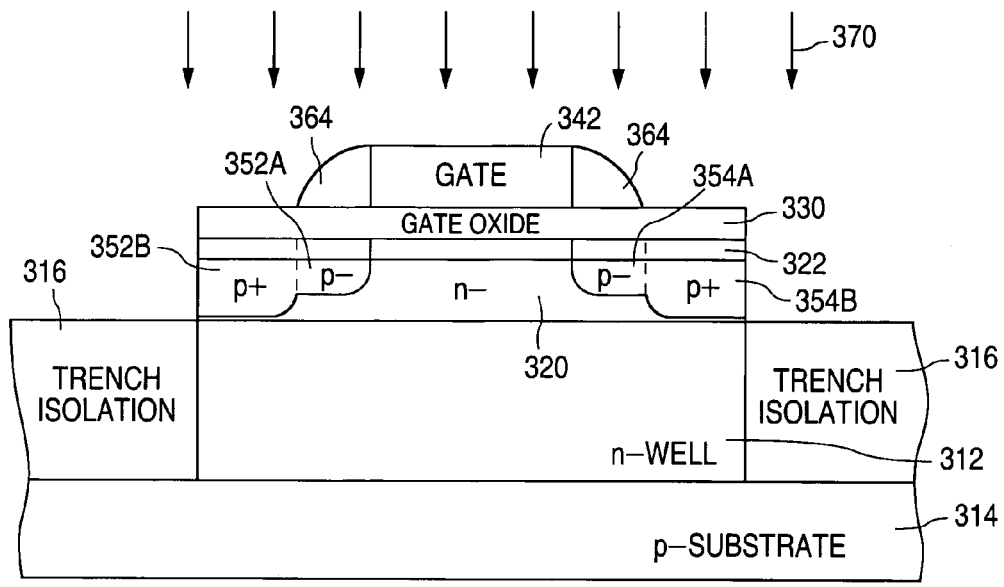

Following this, as shown in FIG. 3E, insulation material 362 is anisotropically etched to remove insulation material from the top surfaces of trench isolation region 316, portions of layer 330, and gate 342. The anisotropic etch forms an insulating spacer 364 on the side walls of gate 342.

The method continues by again implanting layers 320 and 322, and gate 342 with p-type dopant atoms 370. During the second implant, insulating spacer 364 blocks dopant atoms from entering the portions of source region 352A and drain region 354A that lie below insulating spacer 364.

The second implant forms a heavily-doped p-type source region 352B, which contacts adjacent lightly doped p-type source region 352A. In addition, the second implant also forms a heavily-doped p-type drain region 354B, which contacts adjacent lightly-doped p-type drain region 354A. Following the second implant, the wafer is annealed to repair lattice damage caused by the implants. After the wafer has been annealed, the method continues with conventional back end processing steps.

FIGS. 4A–4D show a series of cross-sectional views that illustrate an example of a method of forming a PMOS transistor in accordance with the present invention. As above, the method utilizes a conventionally formed wafer that has an n-well 412 that is formed in a p-substrate 414. In addition, the wafer has a trench isolation region 416 that isolates n-well 412 from laterally adjacent regions. Further, n-well 412 and trench isolation region 416 have upper surfaces that are substantially coplanar.

Figure 4A:
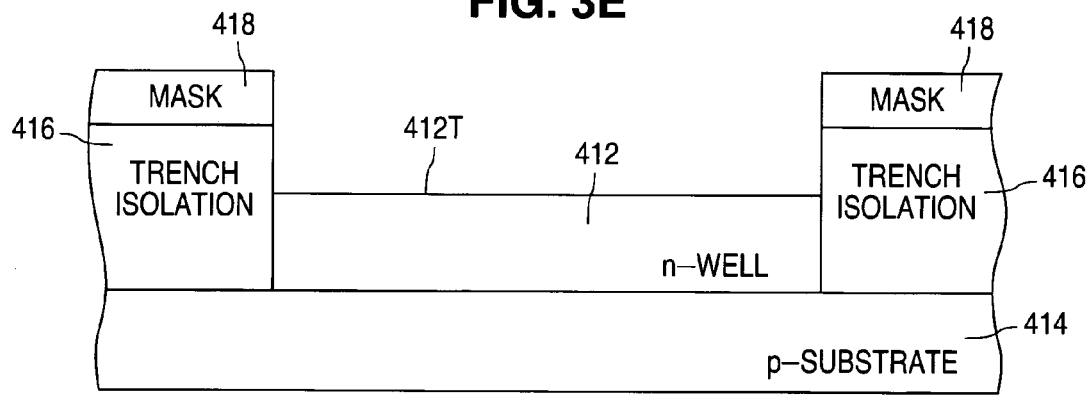
FIGS. 4A–4D are cross-sectional views illustrating an example of a method of forming a PMOS transistor in accordance with an alternate embodiment of the present invention.

As shown in FIG. 4A, the method begins by forming and patterning a mask 418 that exposes n-well 412. Next, the exposed regions of n-well 412 are etched to remove a portion of n-well 412 so that a top surface 412T of n-well 412 is recessed below the top surface of trench isolation region 416. Mask 418 is then removed.

Figure 4B:
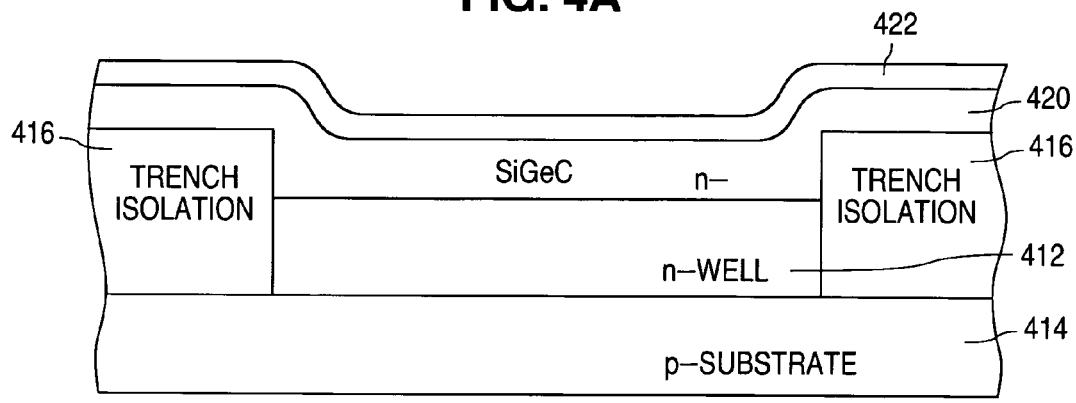

Next, as shown in FIG. 4B, a layer 420 that includes an n-type dopant, silicon, germanium, and carbon is epitaxially grown on the recessed surface 412T of n-well 412 and isolation region 416. (Layer 420 can alternately be selectively epitaxially grown as previously described.)

The distribution and concentration of germanium and carbon present in layer 420 depend on when the germanium and carbon are introduced, and the amount of germanium and carbon that are introduced, during the epitaxial growth process. For example, silicon that is substantially free of germanium and carbon can be grown, followed by the growth of a layer of n-type silicon germanium carbon where the carbon has either a uniform or non-uniform distribution. Alternately, a layer of n-type silicon germanium carbon can be grown on well 412 with either a uniform or non-uniform distribution of carbon.

Figure 4C:
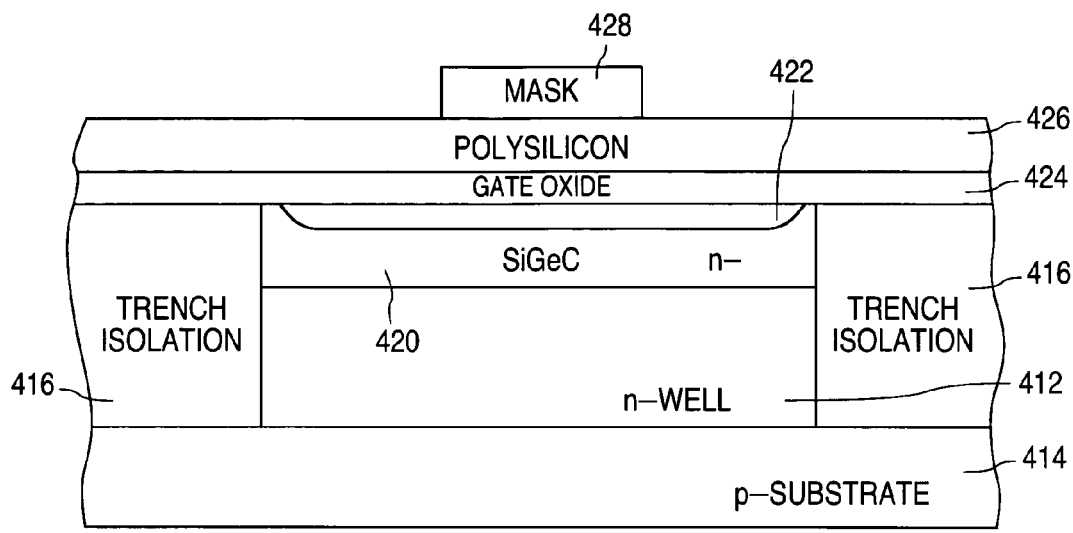

As shown in FIG. 4C, after layer 420 has been grown, a layer of cap silicon 422 is epitaxially grown on layer 420. Layer 422 is then planarized using, for example, chemical-mechanical polishing. The planarization step forms cap silicon layer 422 with a substantially planar upper surface that is substantially coplanar with the upper surface of trench isolation region 416.

(Alternately, the same structure can be realized by growing a layer of silicon on the recessed surface 412T of n-well 412 that is substantially free of germanium and carbon, followed by the blanket deposition of a layer of silicon germanium carbon. A cap silicon layer is formed, and the structure is planarized. The layer of silicon germanium carbon can also be blanket deposited without first forming the layer of silicon that is substantially free of germanium and carbon.)

Once cap silicon layer 422 has been formed and planarized, a layer of insulation material 424, such as a layer of silicon dioxide, is formed over the exposed surfaces of cap silicon layer 422. Following this, a layer of polysilicon 426 is formed on gate oxide layer 424. After polysilicon layer 426 has been formed, a mask 428 is formed and patterned on polysilicon layer 426.

Figure 4D:
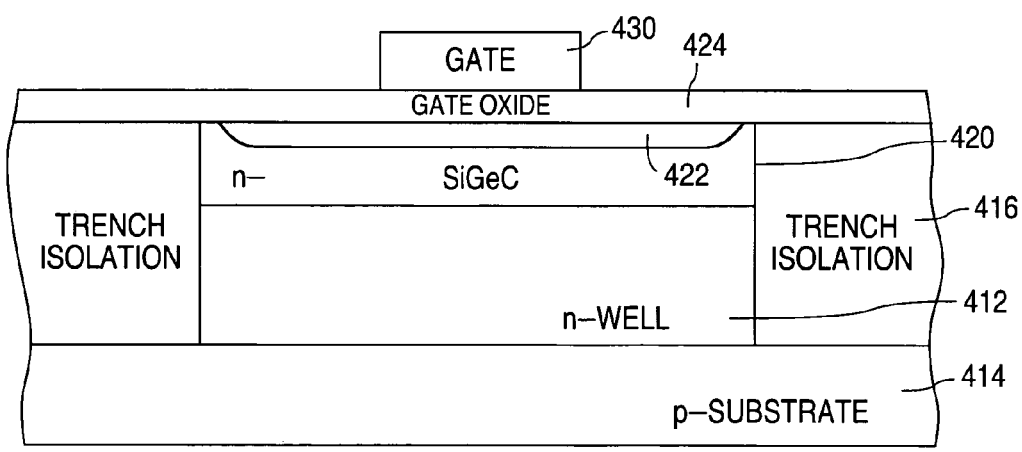

Next, as shown in FIG. 4D, polysilicon layer 426 is anisotropically etched to remove the exposed regions of layer 426 that are not protected by mask 428. Mask 428 is then removed. The etch forms a gate 430 from polysilicon layer 426. The method then continues as described above to form a source region, a spaced-apart drain region, and a side wall spacer. One of the advantages of the formation steps described in FIGS. 4A–4D is that a transistor can be formed that has significantly less variation in surface planarity.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a MOS transistor on a semiconductor material of a first conductivity type, the semiconductor material having a top surface, the method comprising:
   forming a first material over the top surface of the semiconductor material;
   exposing a region of the top surface of the semiconductor material, a portion of the first material being removed and a remaining portion of the first material being left when exposing the region of the top surface of the semiconductor material;

forming a semiconductor layer of the first conductivity type on the top surface of the semiconductor material, the semiconductor layer including silicon, germanium, and carbon;

removing the remaining portion of the first material from over the top surface of the semiconductor material;

forming a layer of insulation material over the semiconductor layer;

forming a layer of conductive material on the layer of insulation material; and removing a portion of the layer of conductive material to form a conductive gate that lies over the semiconductor layer.

2. The method of claim 1 wherein the semiconductor layer is selectively epitaxially grown.

3. The method of claim 2 and further comprising forming spaced-apart source and drain regions of a second conductivity type in the semiconductor layer.

4. The method of claim 2 and further comprising forming a layer of silicon free from germanium and carbon on the semiconductor layer before the remaining portion of the first material is removed, the layer of insulation material contacting a top surface of the layer of silicon.

5. The method of claim 4 and further comprising forming spaced-apart source and drain regions of a second conductivity type in the semiconductor layer and the layer of silicon.

6. The method of claim 1 wherein the semiconductor layer is deposited.

7. The method of claim 6 and further comprising forming spaced-apart source and drain regions of a second conductivity type in the semiconductor layer.

8. The method of claim 6 and further comprising forming a layer of silicon free from germanium and carbon on the semiconductor layer before the remaining portion of the first material is removed, the layer of insulation material contacting a top surface of the layer of silicon.

9. The method of claim 8 and further comprising forming spaced-apart source and drain regions of a second conductivity type in the semiconductor layer and the layer of silicon.

10. The method of claim 1 wherein the first material contacts the top surface of the semiconductor material.

11. The method of claim 10 and further comprising forming spaced-apart source and drain regions of a second conductivity type in the semiconductor layer.

12. The method of claim 11 and further comprising forming a layer of silicon free from germanium and carbon on the semiconductor layer before the remaining portion of the first material is removed, the layer of insulation material contacting a top surface of the layer of silicon.

13. The method of claim 12 and further comprising forming spaced-apart source and drain regions of a second conductivity type in the semiconductor layer and the layer of silicon.

* * * * *